United States Patent [19]

Chou

[11] Patent Number: 4,459,428
[45] Date of Patent: Jul. 10, 1984

[54] THERMOELECTRIC DEVICE AND METHOD OF MAKING SAME

[75] Inventor: Der-Jeou Chou, Troy, Mich.

[73] Assignee: Energy Conversion Devices, Inc., Troy, Mich.

[21] Appl. No.: 372,688

[22] Filed: Apr. 28, 1982

[51] Int. Cl.³ .............................................. H01L 35/28
[52] U.S. Cl. ...................................... 136/211; 29/573; 136/201; 136/205; 136/212; 136/224
[58] Field of Search ............... 136/201, 203, 204, 205, 136/211, 212, 224; 29/573

[56] References Cited

U.S. PATENT DOCUMENTS

| 3,076,051 | 1/1963 | Haba | 136/4 |
| 3,252,205 | 5/1966 | Hancock et al. | 29/155.5 |
| 3,277,827 | 10/1966 | Roes | 103/1 |
| 3,409,475 | 11/1968 | Breneman | 136/203 |
| 3,580,743 | 5/1971 | MacPhee et al. | 136/212 |
| 4,007,061 | 2/1977 | Le Couturier | 136/221 |
| 4,032,363 | 6/1977 | Raag | 136/202 |
| 4,095,998 | 6/1978 | Hanson | 136/208 |
| 4,149,025 | 4/1979 | Niculescu | 136/206 |
| 4,276,441 | 6/1981 | Wilson | 136/211 |
| 4,320,251 | 3/1982 | Narasimhan | 357/65 X |

FOREIGN PATENT DOCUMENTS

| 780,725 | 8/1957 | United Kingdom . |
| 876,474 | 9/1961 | United Kingdom . |
| 1,160,784 | 8/1969 | United Kingdom . |
| 1,264,550 | 2/1972 | United Kingdom . |

Primary Examiner—Leland A. Sebastian
Attorney, Agent, or Firm—Lawrence G. Norris

[57] ABSTRACT

A thermoelectric device includes first and second sets of spaced apart copper plate segments. Thermoelectric elements which generate electricity are disposed between the sets of copper plate segments. The elements are electrically and thermally fastened thereto by a solder paste screen printed on the inner surfaces of the sets of copper plate segments. A ceramic potting compound which absorbs thermal expansion of the device fills the voids between the thermoelectric elements and the copper plate segments and a thick film ceramic insulator coats the outer surfaces of the sets of copper plate segments.

Also disclosed is a method for manufacturing the device of the present invention.

42 Claims, 7 Drawing Figures

THERMOELECTRIC DEVICE AND METHOD OF MAKING SAME

BACKGROUND

The present invention relates to a new and improved thermoelectric device for the generation of electricity and a method for manufacturing the same.

It has been recognized that the world supply of fossil fuels for the production of energy is being exhausted at ever increasing rates. This realization has resulted in an energy crisis which impacts not only the world's economy, but threatens the peace and stability of the world. The solution to the energy crisis lies in the development of new fuels and more efficient techniques to utilize them. To that end, the present invention deals with energy conservation, power generation, pollution, and the generation of new business opportunities by the development of new thermoelectric devices which provide more electricity.

An important part of the solution with respect to the development of permanent, economical energy conversion lies in the field of thermoelectrics wherein electrical power is generated by heat. It has been estimated that more than two-thirds of all our energy, for example, from automobile exhausts or power plants, is wasted and given off to the environment. Up until now, there has been no serious climatic effect from this thermal pollution. However, it has been predicted that as the world's energy consumption increases, the effects of thermal pollution will ultimately lead to a partial melting of the polar ice caps with an attendant increase in sea level.

The efficiency of a thermoelectric device can be expressed in terms of a figure of merit (Z) for the material forming the device, wherein Z is defined as:

$$Z = S^2 \sigma / K$$

Where:
Z is expressed in units $\times 10^3$
S is the Seebeck coefficient in $\mu V/°C$.
K is the thermal conductivity in $mW/cm-°C$.
$\sigma$ is the electrical conductivity in $(\Omega-cm)^{-1}$ From the above, one can see that in order for a material to be suitable for thermoelectric power conversion, it must have a large value for the thermoelectric power Seebeck coefficient (S), a high electrical conductivity ($\sigma$), and a low thermal conductivity (K). Further, there are two components to the thermal conductivity (K): $K_l$, the lattice component; and $K_e$, the electrical component. In non-metals, $K_l$ dominates and it is this component which mainly determines the value of K.

Stated in another way, in order for a material to be efficient for thermoelectric power conversion, it is important to allow carriers to diffuse easily from the hot junction to the cold junction while maintaining the temperature gradient. Hence, high electrical conductivity is required along with low thermal conductivity.

Thermoelectric power conversion has not found wide usage in the past. The major reason for this is that prior art thermoelectric materials which are at all suitable for commercial applications have been crystalline in structure. Crystalline solids cannot attain large values of electrical conductivity while maintaining low thermal conductivity. Most importantly, because of crystalline symmetry, thermal conductivity cannot be controlled by modification.

In the case of the conventional polycrystalline approach, the problems of single crystalline materials still dominate. However, new problems are also encountered by virtue of the polycrystalline grain boundaries which cause these materials to have relatively low electrical conductivities. In addition, the fabrication of these materials is also difficult to control as a result of their more complex crystalline structure. The chemical modification or doping of these materials, because of the above problems are especially difficult.

Among the best known currently existing polycrystalline thermoelectric materials are $(Bi,Sb)_2Te_3$, PbTe, and Si-Ge. The $(Bi,Sb)_2Te_3$ materials are best suited for applications in the $-10°$ C. $+150°$ C. range with its best Z appearing at around 30° C. $(Bi,Sb)_2Te_3$ represents a continuous solid solution system in which the relative amount of Bi and Sb are from 0 to 100%. The Si-Ge material is best suited for high temperature applications in the 600° C. to 1000° C. range with a satisfactory Z appearing at above 700° C. The PbTe polycrystalline material exhibits its best figure of merit in the 300° C. to 500° C. range. None of these materials is well suited for applications in the 100° C. to 300° C. range. This is indeed unfortunate, because it is in this temperature range where a wide variety of waste heat applications are found. Among such applications are geothermal waste heat and waste heat from internal combustion engines in, for example, trucks, buses, and automobiles. Applications of this kind are important because the heat is truly waste heat. Heat in the higher temperature ranges must be intentionally generated with other fuels and therefore is not truly waste heat.

New and improved thermoelectric alloy materials have been discovered for use in the aforesaid temperature ranges. These materials are disclosed and claimed in copending U.S. application Ser. No. 341,864, filed Jan. 22, 1982 in the names of Tumkur S. Jayadev and On Van Nguyen for NEW MULTIPHASE THERMOELECTRIC ALLOYS AND METHOD OF MAKING SAME, which application is assigned to the assignee of the present invention and incorporated herein by reference.

The thermoelectric materials there disclosed can be utilized in the device herein. These materials are not single phase crystalline materials, but instead, are disordered materials. Further, these materials are multiphase materials having both amorphous and multiple crystalline phases. Materials of this type are good thermal insulators. They include grain boundaries of various transitional phases varying in composition from the composition of matrix crystallites to the composition of the various phases in the grain boundary regions. The grain boundaries are highly disordered with the transitional phases including phases of high thermal resistivity to provide high resistance to thermal conduction. Contrary to conventional materials, the material is designed such that the grain boundaries define regions including conductive phases therein providing numerous electrical conduction paths through the bulk material for increasing electrical conductivity without substantially effecting the thermal conductivity. In essence, these materials have all of the advantages of polycrystalline materials in desirably low thermal conductivities and crystalline bulk Seebeck properties. However, unlike the conventional polycrystalline materials, these disordered multiphase materials also have desirably high electrical conductivities. Hence, as disclosed in the aforesaid referenced application, the $S^2\sigma$ product for the figure of merit of these materials can be independently maximized with desirably low thermal conductivities for thermoelectric power generation.

Amorphous materials, representing the highest degree of disorder, have been made for thermoelectric applications. The materials and methods for making the same are fully disclosed and claimed, for example, in U.S. Pat. Nos. 4,177,473, 4,177,474, and 4,178,415 which issued in the name of Stanford R. Ovshinsky. The materials disclosed in these patents are formed in a solid amorphous host matrix having structural configurations which have local rather than long-range order and electronic configurations which have an energy gap and an electrical activation energy. Added to the amorphous host matrix is a modifier material having orbitals which interact with the amorphous host matrix as well as themselves to form electronic states in the energy gap. This interaction substantially modifies the electronic configurations of the amorphous host matrix to substantially reduce the activation energy and hence, increase substantially the electrical conductivity of the material. The resulting electrical conductivity can be controlled by the amount of modifier material added to the host matrix. The amorphous host matrix is normally of intrinsic-like conduction and the modified material changes the same to extrinsic-like conduction.

As also disclosed therein, the amorphous host matrix can have lone-pairs having orbitals wherein the orbitals of the modifier material interact therewith to form the new electronic states in the energy gap. In another form, the host matrix can have primarily tetrahedral bonding wherein the modifier material is added primarily in a non-substitutional manner with its orbitals interacting with the host matrix. Both d and f band materials as well as boron and carbon, which add multiorbital possibilities can be used as modifiers to form the new electronic states in the energy gap.

As a result of the foregoing, these amorphous thermoelectric materials have substantially increased electrical conductivity. However, because they remain amorphous after modification, they retain their low thermal conductivities making them well suited for thermoelectric applications, especially in high temperature ranges above 400° C.

These materials are modified on an atomic or microscopic level with the atomic configurations thereof substantially changed to provide the heretofore mentioned independently increased electrical conductivities. In contrast, the materials disclosed in the aforesaid referenced application are not atomically modified. Rather, they are fabricated in a manner which introduces disorder into the material on a macroscopic level. This disorder allows various phases including conductive phases to be introduced into the material much in the same manner as modification atomically in pure amorphous phase materials to provide controlled high electrical conductivity while the disorder in the other phases provides low thermal conductivity. These materials therefore are intermediate in terms of their thermal conductivity between amorphous and regular polycrystalline materials.

A thermoelectric device generates electricity by the establishment of a temperature differential across the materials contained therein. The thermoelectric devices generally include elements of both p-type and n-type material. In the p-type material the temperature differential drives positively charged carriers from the hot side to the cold side of the elements, while in the n-type material the temperature differential drives negatively charged carriers from the hot side to the cold side of the elements.

Thermoelectric power conversion has not found wide usage in the past not only because of material limitations but also because of device limitations. Among the device limitations are bowing or warping of device substrates, loss of broad surface contact between the device and a heat exchanger when utilized in a thermoelectric system and temperature losses across the substrates.

Thermoelectric devices of the prior art use copper lead patterns placed upon a ceramic substrate for the attachment of thermoelectric elements thereto. In the manufacture of these devices, a second ceramic substrate having another copper lead pattern is sweated onto the thermoelectric elements. Due to the difference in the coefficient of thermal expansion between the ceramic substrates and the copper lead patterns, there occurs a bowing or warping of the substrates during the sweating operation which causes a number of related problems.

First, because of the warping of the substrates, it is difficult if not impossible to obtain a good thermal connection between the elements and the copper lead patterns of the substrates. Additionally, because the ceramic substrates are brittle, the bowing or warping, if severe enough, can cause cracking of the substrates and other physical degradation of the devices. Furthermore, to be employed in a thermoelectric system, the outer surfaces of the substrates must make intimate broad surface contact with a heat exchanger. The warping or bowing of the substrates also makes proper connection between the devices and a heat exchanger difficult.

To overcome these problems, the forces imparted to the substrates caused by the difference in the coefficients of thermal expansion between the copper lead patterns and the ceramic substrates are equalized by applying copper in substantially identical patterns to the other side of the substrates. Unfortunately, the additional copper increases the material cost of the devices and adds extra processing steps to their manufacture.

During the operation of thermoelectric devices a temperature differential is applied across the device to generate electricity. Due to the difference in the coefficient of thermal expansion between the substrates and the thermoelectric elements, loss of broad surface contact occurs between the device and the heat exchanger when utilized in a thermoelectric system. This loss of broad surface contact results in less heat transfer which translates to a lower temperature differential across the device, and lower efficiency of the device.

It has also been found that a substantial temperature drop occurs across the ceramic substrates. The voltage output and the current of a thermoelectric element is proportional to the temperature differential across the element. Therefore, the power is proportional to the square of the temperature differential. Therefore any change in temperature differential across the elements has a substantial effect on the power output of the device. As a result, the temperature drop across the substrates reduces the temperature differential otherwise available to the elements for power generation. Further, the additional copper used to overcome the warping problems adds additional temperature losses across the substrates. These losses undesirably decrease the temperature differential across the thermoelectric elements from the temperature differential available across the devices thereby adversely decreasing the power output of the devices.

The present invention therefore provides a device that solves all of the above noted problems, The device overcomes the problems of warping by the elimination of dissimilar substrate materials having different coefficients of thermal expansion. Also, when utilized in a thermoelectric system it maintains broad surface contact with the heat exchanger. The device also allows a greater temperature differential to exist across the thermoelectric elements for a given temperature differential across the device due to the elimination of the ceramic substrates. The greater temperature differential across the elements of the device of the present invention afford an increase in electrical power output of at least 70% over the electrical power output obtainable from prior art devices for a given total temperature differential. The device uses less copper, has fewer processing steps, is lighter, thinner and costs less to manufacture than prior art devices.

SUMMARY OF THE INVENTION

The present invention provides a new and improved thermoelectric device for the generation of electricity and a method of manufacturing the same. The new thermoelectric device includes absorbing means for absorbing thermal expansion of the device during use to maintain broad surface contact with a heat exchanger when used in a thermoelectric system. The new thermoelectric device also has fewer component parts and is less costly to manufacture than thermoelectric devices of the prior art. Also, the device is thinner, lighter and able to utilize more of the temperature differential across the device for the generation of electricity.

The thermoelectric device of the present invention includes first and second sets of copper plate segments with a solder paste screen printed onto the inner surfaces thereof. The first and second sets of copper plate segments are spaced apart with the thermoelectric elements, which generate the electricity, being disposed between and soldered to the copper plate segment inner surfaces. The copper segments define a lead pattern which connect the thermoelectric elements electrically in series and thermally in parallel. A ceramic potting compound having high electrical and thermal resistivity fills the voids between the thermoelectric elements and the copper plate segments to thus insulate and protect the elements. The copper plate segments also include a layer of thick film insulator on the outer surfaces thereof opposite the solder paste. These insulating thick films serve as a mask for fabricating the copper plate segments during an etching operation in the manufacture of the device and also serve to electrically insulate the copper segments and thermoelectric elements from a heat exchanger when incorporated into a thermoelectric system.

The above described thermoelectric device is manufactured in accordance with the present invention by first providing first and second relatively thin and substantially planar copper plates. A thick film of ceramic paste insulating material is applied onto one surface of each copper plate in a pattern which duplicates the size, shape, and orientation of the copper plate segments of the finished device. Next, a solder paste is then screen printed onto the other side of each plate. The solder paste is applied in a pattern which resembles the thick film pattern of the respective plates. The solder paste printed onto the first plate preferaby has a higher melting temperature than the solder paste printed onto the second copper plate. The thermoelectric elements are then soldered to the first plate by a reflow soldering process in an inert atmosphere of nitrogen, for example. Thereafter, the second plate is applied to the other side of the elements and soldered thereto by a similar reflow soldering process in an inert atmosphere.

The device is now ready for final processing. All of the sides but one side of the partially completed device are bordered by a suitably configured jig to form a cavity with the copper plates. A ceramic potting compound having high thermal and electrical resistivity is then flowed into the cavity to fill the open spaces about the elements. After the potting compound is dried, the outer surfaces of the copper plates having the thick film ceramic paste thereon are subjected to a copper etchant. During this etching operation the etchant attacks and etches away the exposed copper defined by the ceramic thick film pattern. The etching operation continues until the exposed copper portions are fully etched leaving the heretofore mentioned copper plate segments which now connect the elements electrically in series and thermally in parallel. The completed device is now ready for final rinsing and drying.

The thermoelectric device and method of manufacture hereinabove described provides a more efficient device for the generation of electricity responsive to a temperature differential thereacross without the associated disadvantages of devices incorporating substrates.

By eliminating the relatively thick ceramic substrates of the prior art, the substrateless device of the present invention is lighter in weight and thinner than such prior art devices. Also, excessive temperature losses across the device are eliminated with the elimination of the substrates previously employed. This allows a greater temperature differential to be applied across the thermoelectric elements which generate the electricity. Because the power output of such devices is directly proportional to the square of the temperature differential across the thermoelectric elements, a substantial increase in electrical power output is obtained for a given total temperature differential.

The elimination of the substrate also aids in the manufacture of such devices by eliminating the previously experienced bowing or warping of the substrates while simultaneously avoiding the need for extra material to correct it. The ceramic potting compound absorbs any thermal expansion of the device in use, to maintain broad surface contact between the device and heat exchanger when used in a thermoelectric system. Further, the copper plate segments experience a localized thermal expansion rather than a total or entire thermal expansion of prior art substrates to distribute the expansion and to lessen any deleterious effects caused thereby. All of the foregoing reduces the cost of materials and the number of required process steps.

DETAILED DESCRIPTION

In accordance with the present invention the new and improved thermoelectrc device and method for manufacturing the same, shall now be described with reference to the drawings.

Figure 7:
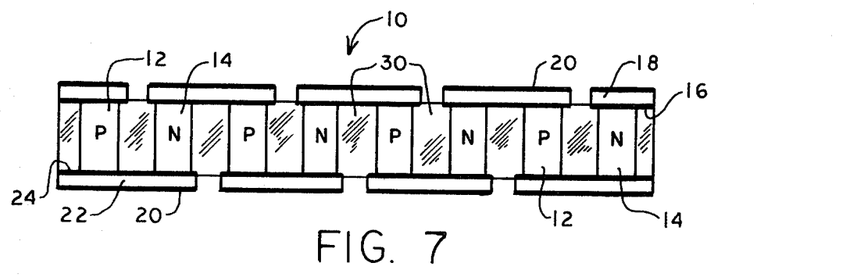
FIG. 7 is a side view of the completed thermoelectric device embodying the present invention.

FIG. 7 discloses a substrateless thermoelectric device embodying the present invention at reference numeral 10. The device 10 generates electricity by the establishment of a temperature differential thereacross. The temperature differential drives flux through p-type and n-type thermoelectric elements 12 and 14. In the n-type element 14 the temperature differential drives negative carriers from the hot side to the cold side. In the p-type element 12 the temperature differential drives positive carriers from the hot side to the cold side. It is the movement of the positive and negative carriers which generates electricity.

Figure 4:
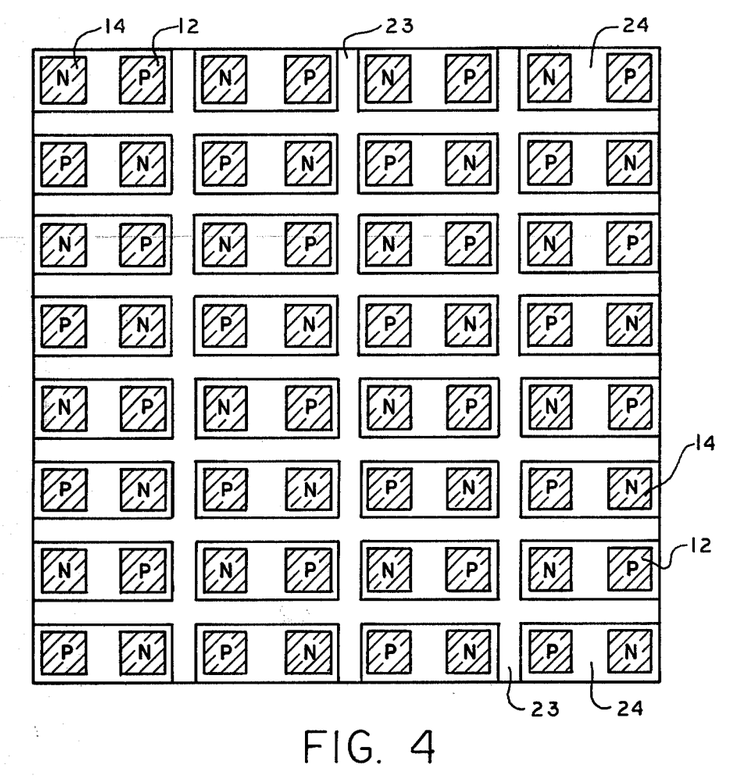
FIG. 4 is a cross sectional view taken along lines 4—4 of FIG. 3.

The p-type and n-type thermoelectric elements 12 and 14 are equal in number and alternate throughout as best shown in FIG. 4. FIG. 4 illustrates thirty-two p-type elements 12 and thirty-two n-type elements 14 by way of example, but any equal number of p-type and n-type elements will suffice. A representive composition utilized for the p-type elements 12 comprises from about ten to twenty percent bismuth, about twenty to thirty percent antimony, about sixty percent tellurium, and less than one percent silver. This material and others usable as p-type elements are disclosed and claimed in the aforementioned copending U.S. application Ser. No. 341,864, filed Jan. 22, 1982, for New Multiphase Thermoelectric Alloys and Method for Making Same, which application is assigned to the assignee of the present invention and incorporated herein by reference. The n-type elements may comprise about forty percent bismuth, about fifty-four percent tellurium, and about six percent selenium.

Referring again to FIG. 7, the p-type and n-type elements 12 and 14 of the substrateless thermoelectric device 10 are thermally affixed to interior surfaces of spaced apart first and second sets of copper plate segments 22 and 18 respectively. The interior surfaces of the copper plate segments 18 and 22 have a solder paste 16 and 24 screen printed thereon for thermally and electrically connecting the elements 12 and 14 to the copper plate segments 18 and 22 respectively. The copper plate segments 18 and 22 define a lead pattern for connecting the elements 12 and 14 electrically in series and thermally in parallel.

A ceramic potting compound 30 such as a proprietary phenol-formaldehyde resin supplied by Aremco Products, Inc., under the trademark Aremco-Cast 554 or the like for example, fills the voids between the elements 12 and 14 and the copper plate segments 18 and 22. The ceramic potting compound 30 has qualities of high electrical and thermal resistivity to insulate the elements and to protect the elements from contamination. The ceramic potting compound 30 also acts to absorb thermal expansion of the device during its use. The copper plate segments 18 and 22 also include a layer of a thick film ceramic 20 such as a borate silica glass supplied by Electro-Science Laboratories, Inc. under the trademark ESL #4906 for example or the like, on the outer surfaces of the segments 18 and 22 opposite the solder paste 16 and 24. The thick film ceramic 20 has high electrical resistivity to electrically insulate the copper plate segments 18 and 22 when employed in conjunction with a heat exchanger and has a high thermal conductivity to maximize the temperature differential across the elements 12 and 14 for a given temperature differential across the device 10. The thick film ceramic 20 has a dual function of serving as a mask for fabricating the copper plate segments 18 and 22 which will be discussed in greater detail subsequently and electrically insulating the thermoelectric device 10 from a heat exchanger when utilized in a thermoelectric system to generate electricity.

The substrateless thermoelectric device 10 is manufactured in accordance with the present invention by providing a pair of relatively thin and substantially planar copper plates 19 and 23. The copper plates 19 and 23 are about 0.020 inches in thickness.

Figure 1:
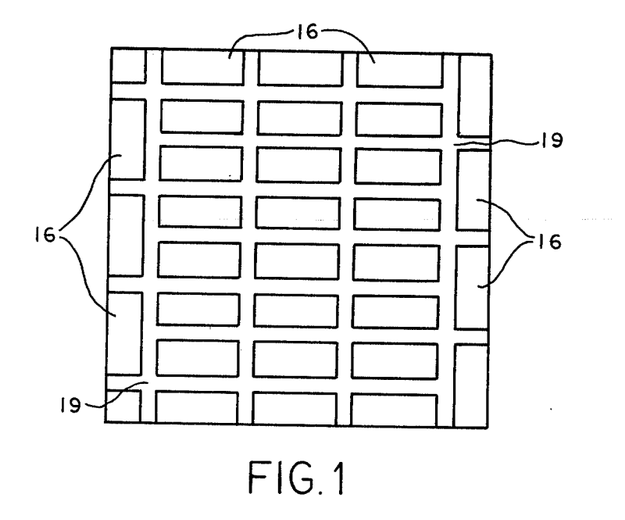
FIG. 1 is a bottom plan view of a planar copper plate having solder paste screen printed thereon in accordance with the present invention.

A thick film ceramic paste 20 is screen printed on the opposite side of the copper plate 19 shown in FIG. 1, in a pattern which resembles the patterns there shown. The thick film ceramic paste 20 has the characteristics of being a good electrical insulator and a good thermal conductor and may be ESL M4906 or the like for example. The thick film ceramic is dried at 125° C. for 15 minutes and then fired for 30 minutes at 900° C. After the thick film has been fired, a solder paste 16 is screen printed upon copper plate 19 in a pattern as shown in FIG. 1 which duplicates the size, shape and orientation of the copper plate segments 18 of the finished device 10. The copper plate 19 with the solder paste 16 thereon is then dried at about 120° C. for 15 minutes.

Figure 2:
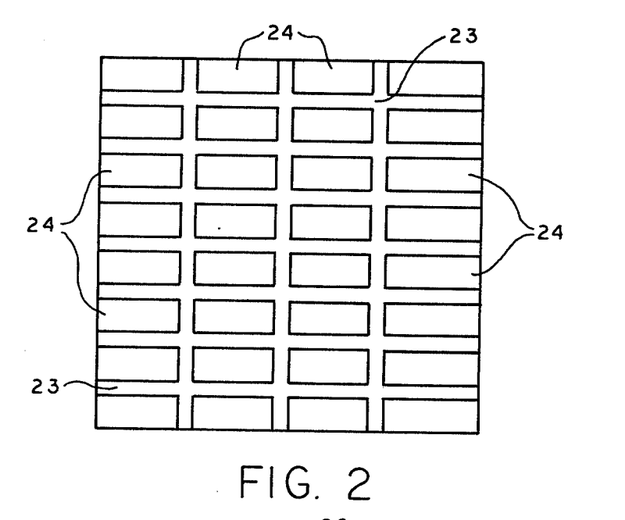
FIG. 2 is a top plan view of another planar copper plate having solder paste screen printed thereon in accordance with the present invention.

The thick film ceramic paste 20 is screen printed on the opposite side of the copper plate 23, shown in FIG. 2, in a pattern which resembles the pattern there shown. The copper plate 23 is then screen printed with a solder paste 24 in a pattern as shown in FIG. 2. The copper plate 23 is then prepared in an analogous fashion to the copper plate 19.

Figure 3:
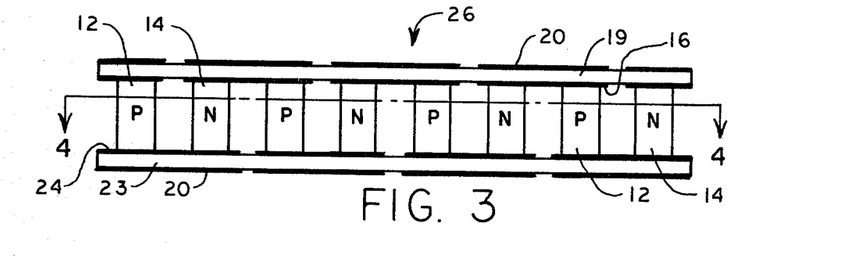
FIG. 3 is a side view of a partially completed thermoelectric device embodying the present invention at one stage of its manufacture.

Referring now to FIG. 3, the p-type and n-type elements 12 and 14 are connected to the copper plate 23 in equal number and alternating throughout, by reflowing the solder paste 24 in the presence of an inert atmosphere, such as nitrogen for example, at about 350° C. The copper plate 19 is then placed upon the p-type and n-type elements 12 and 14 with the solder paste 16 contacting the elements. The solder paste 16 is then reflowed in an inert atmosphere at a temperature of about 300° C. or lower to connect the elements 12 and 14 to the copper plate 19 to form the partially completed device 26 of FIG. 3 in accordance with the present invention.

The solder paste 16 is chosen to melt at a lower temperature than that of the solder paste 24. This facilitates the assembly of the copper plates 19 and 23 to the thermoelectric elements 12 and 14 without melting the previously reflowed solder 24.

Figure 5:
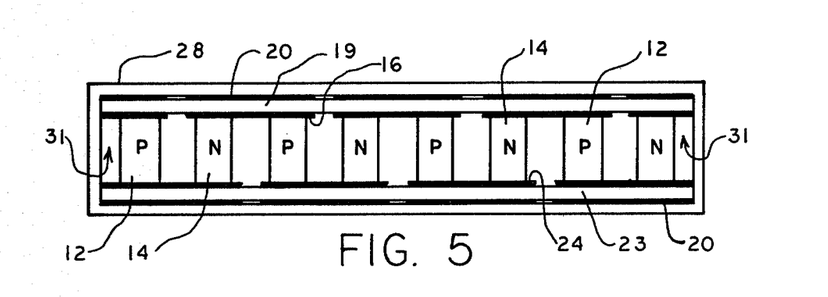
FIG. 5 is a side view of the partially completed thermoelectric device of FIG. 3 embodying the present invention at a further stage of its manufacture.

As shown in FIG. 5 the partially completed device 26 of FIG. 3 is placed in a jig 28 which encloses all of the sides of the device 26 but one side to form with the copper plates 19 and 23 a cavity 31. This facilitates the injection of the ceramic potting compound into the cavity 31 to fill the area between the copper plates 19 and 23 and the elements 12 and 14. The ceramic potting compound exhibits the qualities of high thermal resistivity and electrical resistivity and may be Aremco 554 or the like for example. The compound acts to absorb thermal expansion of the device while in use to maintain broad surface contact between the elements and the segments. Further, the compound 30 protects the elements 12 and 14 from the environment and possible contamination therefrom.

Figure 6:
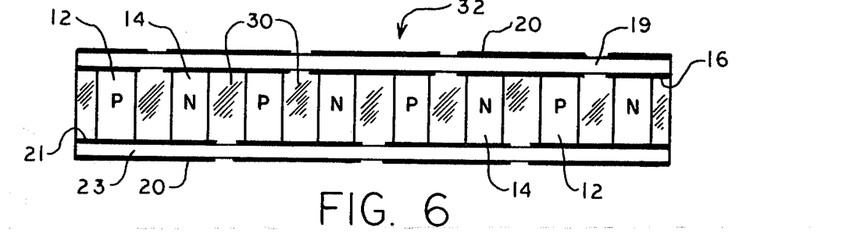
FIG. 6 is a side view of the partially completed thermoelectric device of FIG. 3 embodying the present invention at a still further stage of its manufacture.

As shown in FIG. 6, once the ceramic potting compound 30 has filled all the voids between the plates 19 and 23, the partially completed device is dried for 24 hours at 90° C. After drying, the assembly 32, of FIG. 6 is formed. The assembly 32 is now ready for final processing. The outer surfaces of the copper plates 19 and 23 having the thick film ceramic 20 thereon are then exposed to a copper etchant such as Ultra Etch 50 by McDermott, Inc. for example. The etchant is applied to attack and etch away the exposed copper surfaces of the copper plates 19 and 23 defined by the pattern of the thick film ceramic 20. The etching process continues until the exposed copper surfaces are fully etched leaving the copper plate segments 18 and 22 which now connect the elements 12 and 14 electrically in series and thermally in parallel. The completed device is then rinsed and dried.

The substrateless thermoelectric device 10 provides a thin, lightweight construction by the elimination of the ceramic substrate utilized in prior art devices. The ceramic potting compound 30 serves as a support for the device, as an absorber of thermal expansion for the device in use as well as protecting the thermoelectric elements 12 and 14 from the environment. The potting compound 30 also is a good electrical and thermal insulator for the elements 12 and 14. The thick film ceramic 20 electrically insulates the copper segments 18 and 22 of the device 10 when connected to a heat exchanger and used to generate electricity in a thermoelectric system. The copper segments 18 and 22 experience a more localized thermal expansion versus a total or long range expansion experienced by substrates of the prior art and is thus able to distribute the expansion equally without harming the device. This new concept decreases material and production costs.

It is well known that electrical power output is proportional to the square of the temperature differential because the voltage and the current of a thermoelectric device are proportional to the temperature differential across the elements of the device. Therefore the electrical power output of a thermoelectric device is proportional to the square of the temperature differential across the elements. For a given temperature differential across a thermoelectric device any temperature losses which decrease the temperature differential across the thermoelectric elements markedly reduce the electrical power output of the device.

The substrateless thermoelectric device of the present invention, by eliminating the thick ceramic substrates exhibits lower temperature losses and therefore higher temperature differentials across the thermoelectric elements. For example, in a given application wherein there was available a 280° C. temperature differential, a prior art device of the type previously described exhibited a substantial temperature loss of 80° C. across the ceramic substrates to reduce the temperature differential available across the thermoelectric elements to 200° C. In a device structured in accordance with the present invention, for the same 280° C. temperature differential, there was a total temperature differential loss of only 20° C. to provide a 260° C. temperature differential across the thermoelectric elements. As a result, there was a seventy percent increase in electrical power output provided by the thermoelectric device of the present invention over that provided by the thermoelectric device of the prior art.

Modifications and variations of the present invention are possible in light of the above teachings. It is therefore, to be understood that within the scope of the appended claims the invention may be practiced otherwise than as specifically described.

I claim:

1. A thermoelectric device comprising:
   at least two thermoelectric elements;
   coupling means for coupling said elements electrically in series and thermally in parallel; and
   absorbing means for absorbing the thermal expansion of said thermoelectric elements and said coupling means when a temperature differential is applied across said device.

2. The thermoelectric device as defined in claim 1, wherein said coupling means include a first set of conducting plate segments each segment having an inner surface and a second set of conducting plate segments each segment having an inner surface spaced from said first set of conducting plate segment inner surfaces.

3. The thermoelectric device as defined in claim 2, wherein said at least two thermoelectric elements are disposed between said first and second conducting plate segments and are fastened to said inner surface.

4. The thermoelectric device as defined in claim 3, wherein two thermoelectric elements of said elements are fastened to one conducting plate segment of one set of conducting plate segments and each element of said two thermoelectric elements is fastened to a conducting plate segment of the other set of said conducting plate segments.

5. The thermoelectric device as defined in claim 4, wherein said absorbing means is an insulating material surrounding said at least two thermoelectric elements between said coupling means.

6. The thermoelectric device as defined in claim 5, wherein said insulating material is a potting ceramic.

7. A thermoelectric device comprising:
   first conducting plate segment means having an inner surface;
   second conducting plate segment means having an inner surface spaced from said first conducting plate segment means inner surface;
   at least two thermoelectric elements disposed between said first and second conducting plate segment means and being fastened to the inner surfaces of said first and second conducting plate segment means;
   a first insulating material surrounding said elements between the conducting plate segment means, said insulating material also being capable of absorbing the thermal expansion of said thermoelectric elements and said conducting plate means when a temperature differential is applied across said device;
   said first and second conducting plate segment means being fastened to said at least two thermoelectric elements such that said elements are electrically coupled in series and are thermally coupled in parallel; and wherein the outer surfaces of said first and second conducting plate segment means are coated with a second insulating material exhibiting high thermal conductivity and low electrical conductivity.

8. The thermoelectric device as defined in claim 7, wherein said second insulating material serves for fabricating said first and second conducting plate segment means.

9. The thermoelectric device as defined in claim 8, wherein said second insulating material is a thick film ceramic.

10. The thermoelectric device as defined in claim 7, wherein said insulating material is a potting ceramic.

11. The thermoelectric device as defined in claim 7 or 8 wherein said first and second conducting plate segment means are copper.

12. The thermoelectric device as defined in claim 7 wherein said thermoelectric elements are fastened to said first and second conducting plate segment means by solder.

13. The thermoelectric device as defined in claim 12 wherein the solder fastening said thermoelectric elements to said first conducting plate segment means has a higher melting temperature than the solder fastening said thermoelectric elements to said second conducting plate segment means.

14. The thermoelectric device as defined in claim 7 wherein said at least two thermoelectric elements comprise at least one p-type element and at least one n-type element.

15. The thermoelectric device as defined in claim 14 further comprising a plurality of said n-type and p-type elements in equal number.

16. A thermoelectric device comprising:
a first set of copper plate segments having an inner surface;
a second set of copper plate segments having an inner surface spaced from said first set of copper plate segments;
a plurality of thermoelectric elements electrically and thermally connected to the inner surfaces of said first and second sets of copper plate segments;
said first and second sets of copper plate segments defining a lead pattern which connect said thermoelectric elements electrically in series and thermally in parallel;
a ceramic potting compound for absorbing the thermal expansion of said thermoelectric elements and said copper plate segments when a temperature differential is applied across the device, said compound having high electrical and thermal resistivity, said compound filling in voids between said thermoelectric elements and said first and second sets of copper plate segments; and
a coating of a material having high thermal conductivity and low electrical conductivity over the individual outer surfaces of at least one of said first and second sets of segments.

17. The thermoelectric device as defined in claim 16, wherein said thermoelectric elements are fastened to said first and second sets of copper plate segments by solder paste.

18. The thermoelectric device as defined in claim 17, wherein said solder paste fastening said thermoelectric elements to said first set of copper plate segments has a higher melting point than said solder paste fastening said thermoelectric elements to said second set of copper plate segments.

19. A thermoelectric device comprising:
at least two thermoelectric elements;
coupling means for coupling said elements electrically in series and thermally in parallel, said coupling means having an outer surface; and
a coating material over at least part of said outer surface of said coupling means, said material having a high thermal conductivity and a low electrical conductivity.

20. The thermoelectric device as defined in claim 19 wherein said coupling means include a first set of conducting plates segments, each segment having an inner surface, and a second set of conducting plates segments, each segment having an inner surface spaced from said first set of conducting plate segment inner surfaces.

21. The thermoelectric device as defined in claim 20, wherein said at least two thermoelectric elements are disposed between said first and second conducting plate segments and are fastened to said inner surfaces.

22. The thermoelectric device as defined in claim 21, wherein two thermoelectric elements of said elements are fastened to one conducting plate segment of one set of conducting plate segments and each element of said two thermoelectric elements is fastened to a conducting plate segment of the other set of said conducting plate segments.

23. The thermoelectric device as defined in claim 22, wherein said coating material is a thick film ceramic which is deposited over at least part of said outer surfaces of said conducting plate segments.

24. A method of manufacturing a thermoelectric device comprising the steps of:
fastening at least two thermoelectric elements to the inner surface of a substantially planar first conducting layer;
fastening the inner surface of a substantially planar second conducting layer to said at least two thermoelectric elements on the side thereof opposite said first conducting layer;
injecting an insulating material between said elements and said layers, said insulating material also for absorbing the thermal expansion of said thermoelectric device when a temperature differential is applied across said device; and
etching said first and second conducting layers in a pattern to form first and second conducting plate segment means such that said at least two thermoelectric elements are connected electrically in series and thermally in parallel by said first and second conducting plate segment means.

25. The method as defined in claim 24 including the initial step of coating the outer surfaces of said first and second conducting layers with a second insulating material.

26. The method as defined in claim 25 including the further step of coating said second insulating material onto said outer surfaces of said first and second conducting layer to form an etching pattern for the formation of said first and second conducting plate segment means.

27. The method as defined in claim 26 wherein said second insulating material has a high thermal conductivity and a low electrical conductivity.

28. The method as defined in claim 27 wherein said second insulating material is a thick film ceramic.

29. The method as defined in claim 24 wherein said insulating material is a potting ceramic.

30. The method as defined in claim 24 wherein said first and second conducting layers are copper.

31. The method as defined in claim 25 including the additional step of screen printing the inner surfaces of said conducting layers with a solder paste in a pattern which resembles the pattern etched in said first and second conducting layers to form said first and second conducting plate segment means.

32. The method as defined in claim 31 including the additional step of drying said solder paste.

33. The method as defined in claim 24 wherein said at least two thermoelectric elements are fastened to said conducting layers by reflowing said solder.

34. The method as defined in claim 33 wherein the solder used to fasten said at least two thermoelectric elements to said first conducting layer has a higher melting point than the solder used to fasten said thermoelectric elements to said second conducting layer.

35. The method as defined in claim 34 comprising the additional step of reflowing said solder in a reducing atmosphere.

36. The method as defined in claim 26 wherein said at least two thermoelectric elements comprise one p-type and one n-type element.

37. The method as defined in claim 36 wherein there are soldered to the conducting layers a plurality of n-type and p-type elements in equal number.

38. The method as defined in claims 24, 25 or 32 including the additional step of rinsing said device after etching.

39. A method of manufacturing a thermoelectric device comprising the steps of:

electrically and thermally fastening a plurality of thermoelectric elements to the inner surface of a thin, substantially planar first copper plate;

electrically and thermally fastening the inner surface of a thin substantially planar second copper plate to said plurality of thermoelectric elements on the side thereof opposite said first copper plate;

flowing a ceramic potting compound having a high electrical and thermal resistivity between said thermoelectric elements and said first and second copper plates, said compound for both insulating and absorbing thermal expansion in said device when a temperature differential is applied across said device; and etching said first and second copper plates to form copper plate segments which define a lead pattern coupling said thermoelectric elements electrically in series and thermally in parallel.

40. The method as defined in claim 39 wherein a solder paste is screen printed onto said first and second copper plates in a pattern which duplicates the size, shape and orientation of said copper plate segments.

41. The method as defined in claim 40, wherein the solder paste screen printed on said first copper plate has a higher melting point than the solder paste screen printed on said second copper plate.

42. The method as defined in claim 39 or 40 including the initial step of coating the outer surfaces of said first and second copper plates with a thick film ceramic insulating material in a pattern which duplicates the size, shape and orientation of said copper plate segments.

* * * * *

UNITED STATES PATENT AND TRADEMARK OFFICE
CERTIFICATE OF CORRECTION

PATENT NO. : 4,459,428

DATED : July 10, 1984

INVENTOR(S) : Der-Jeou Chou

It is certified that error appears in the above-identified patent and that said Letters Patent is hereby corrected as shown below:

Col. 2, line 36, delete "copending";
    Col. 2, line 36, delete "application" and insert --Application--;
    Col. 2, line 40, after "SAME" insert --now abandoned in favor of U.S. Continuation-in-part application Serial No. 412,306, filed 8/27/82 and allowed 9/26/83--;
    Col. 5, line 4, delete "," and insert --.--;
    Col. 7, line 34, delete "representive" and insert --representative--;
    Col. 7, line 40, delete "copending"; and
    Col. 7, line 43, after "Same," insert --now abandoned in favor of U.S. Continuation-in-part application Serial No. 412,306, filed 8/27/82 and allowed 9/27/83,--.

Signed and Sealed this

Eighth Day of January 1985

[SEAL]

*Attest:*

*Attesting Officer*

GERALD J. MOSSINGHOFF

*Commissioner of Patents and Trademarks*